(12) United States Patent
Sinha et al.

(10) Patent No.: US 7,557,631 B2
(45) Date of Patent: Jul. 7, 2009

(54) VOLTAGE AND TEMPERATURE COMPENSATION DELAY SYSTEM AND METHOD

(75) Inventors: Manoj Sinha, Austin, TX (US); Sugato Mukherjee, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 256 days.

(21) Appl. No.: 11/594,690

(22) Filed: Nov. 7, 2006
(Under 37 CFR 1.47)

(65) Prior Publication Data

US 2008/0106954 A1    May 8, 2008

(51) Int. Cl.
*H03H 11/26* (2006.01)

(52) U.S. Cl. .................. 327/261; 327/262; 327/513

(58) Field of Classification Search .............. None
See application file for complete search history.

(56) References Cited

U.S. PATENT DOCUMENTS

| | | | |
|---|---|---|---|
| 5,081,380 A * | 1/1992 | Chen ............... | 327/262 |
| 6,774,733 B2 * | 8/2004 | Arima ............. | 331/57 |
| 6,788,126 B2 * | 9/2004 | Stave ............. | 327/363 |
| 7,230,467 B1 * | 6/2007 | Gan et al. ........ | 327/261 |
| 2007/0008022 A1 * | 1/2007 | Kuramori ......... | 327/261 |

* cited by examiner

*Primary Examiner*—An T Luu
(74) *Attorney, Agent, or Firm*—Dorsey & Whitney LLP

(57) ABSTRACT

A delay circuit provides a voltage and temperature compensated delayed output signal. The delay circuit includes a first delay stage that receives an input signal, and generates a delayed output signal from the input signal. The delay circuit also includes a second delay stage that receives the delayed output signal of the first delay stage, and generates a delayed output signal from the output of the first delay stage. The first delay stage and the second delay stage are coupled a voltage supply. The magnitude of the delay of the second delayed signal is inversely proportional to the magnitude of the supply voltage to substantially the same degree that the delayed output signal of the first delay stage is proportional to the magnitude of the supply voltage.

50 Claims, 6 Drawing Sheets

VOLTAGE AND TEMPERATURE COMPENSATION DELAY SYSTEM AND METHOD

TECHNICAL FIELD

This invention relates generally to integrated circuits, and more specifically, to compensating for variations in voltage and temperature in a circuit providing delays to electrical signals.

BACKGROUND OF THE INVENTION

Delay circuits are commonly used for a variety of purposes in integrated circuits to perform operations at predetermined times relative to the rising and falling edges of digital signals such as those found in clock signals, timing delay circuits, and oscillators. Examples of integrated circuits utilizing any number of such components include synchronous memory devices such as synchronous dynamic random access memories (SDRAMs), synchronous static random access memories (SSRAMs), and packetized memories like SLDRAMs and RDRAMs, and include other types of integrated circuits as well, such as microprocessors. The timing of signals external to a synchronous memory device is determined by an external clock signal, and operations within the memory device typically must be synchronized to both the external operations and to components within the device itself. For example, commands are placed on a command bus of the memory device in synchronism with the external clock signal, and the memory device must latch these commands at the proper times to successfully capture the commands. To latch the applied commands, an internal clock signal is developed in response to the external clock signal, and is typically applied to latches contained in the memory device to thereby clock the commands into the latches. The internal clock signal and external clock must be synchronized to ensure the internal clock signal clocks the latches at the proper times to successfully capture the commands. Although the present description is directed to memory devices, the principles described herein are equally applicable to other types of integrated circuits.

A typical delay circuit 100 for conventional memory devices is shown in FIG. 1. The delay circuit 100 provides a delay that varies according to changes in a supply voltage applied to the delay circuit 100 or as the temperature of the delay circuit 100 varies. While the design of the delay circuit 100 is relatively simple, designing one that can be set precisely to a required delay period that is constant over variations in voltage and temperature is difficult. The conventional delay circuit 100 of FIG. 1 includes a first delay stage 101 and a second delay stage 102. The total delay provided by the delay circuit 100 is the sum of the delay of the first delay stage 101 and the delay of the second delay stage 102. More delay stages may be connected to the delay circuit 100 to increase the total delay. The first delay stage 101 includes a PMOS transistor 134 and an NMOS transistor 136 having a drain connected to a drain of the PMOS transistor 134. The respective gates of the PMOS transistor 134 and the NMOS transistor 136 are connected to each other and receive an input signal $V_{IN}$. The transistors 134, 136 function as an inverter having an output node 140. A supply voltage $V_{CC}$ connected to the delay circuit 100 at a node 150 is applied to a source of the PMOS transistor 134 through a PMOS transistor 132. Similarly, a source of the NMOS transistor 136 is connected to ground through an NMOS transistor 138. The PMOS transistor 132 and the NMOS transistor 138 are designed with a long channel length to provide a high resistance between the supply voltage and the PMOS transistor 134 and between the NMOS transistor 136 and ground, respectively. A capacitor 146 is connected to the output node 140 of the first delay stage 101 to increase the delay of the first delay stage 101. Each delay stage of the delay circuit 100 are configured in the same manner and function in the same way, however, in the interest of brevity only the first delay stage 101 is described in detail.

In operation, when $V_{IN}$ is low, the NMOS transistor 136 is turned OFF and the PMOS transistor 134 is turned ON to connect the supply voltage $V_{CC}$ to the capacitor 146 through the PMOS transistor 132. The capacitor 146 is then charged towards $V_{CC}$ with a delay that is determined by the time required for the capacitor 146 to charge through the PMOS transistor 132 to a threshold $V_{CC}/2$ of the first stage 101. The delay is therefore essentially determined by the resistance of the PMOS transistor 132 and the capacitance of the capacitor 146. When $V_{IN}$ subsequently transitions from low-to-high, the PMOS transistor 134 is turned OFF and the NMOS transistor 136 is turned ON to connect the capacitor 146 to ground through the NMOS transistor 138. The capacitor 146 is then discharged towards ground with a delay that is determined by the time required for the capacitor 146 to discharge through the NMOS transistor 138 to a threshold $V_{CC}/2$ of the second stage 102. Again, the delay is essentially determined by the resistance of the NMOS transistor 138 and the capacitance of the capacitor 146.

The delays provided by the first and second stages 101, 102, respectively, will be constant as long as the supply voltage $V_{CC}$ and the resistances of the transistors 132, 138 are constant. Unfortunately, the magnitude of the supply voltage $V_{CC}$ can vary, and the resistances of the transistors 132, 138 can vary with temperature. For example, the delay of the first delay stage 101 and the delay of the second delay stage 102 will decrease as the supply voltage is increased because the capacitor 146 will charge to the higher voltage more quickly and the higher voltage to which the capacitor 146 is charged will cause it to discharge more quickly. As a result, the total delay of the delay circuit 100 will decrease as the supply voltage increases and increase as the supply voltage decreases. The same effect will result as the temperature varies, since the charge current through the PMOS transistor 132 and the discharge current through the NMOS transistor 138 vary with the temperature induced changes in the resistances of the transistors 132, 138. These variations in the delay caused by variations in supply voltage and temperature are undesirable in integrated circuits that require constant delays to properly time internal operations and to synchronize circuits internal to integrated circuits with external signals.

Therefore, there is a need for a delay circuit to provide a constant delay that is independent of voltage and temperature variations.

DETAILED DESCRIPTION

Embodiments of the present invention are directed to circuits providing voltage and temperature compensated delays to electrical signals applied to an integrated circuit. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 2:
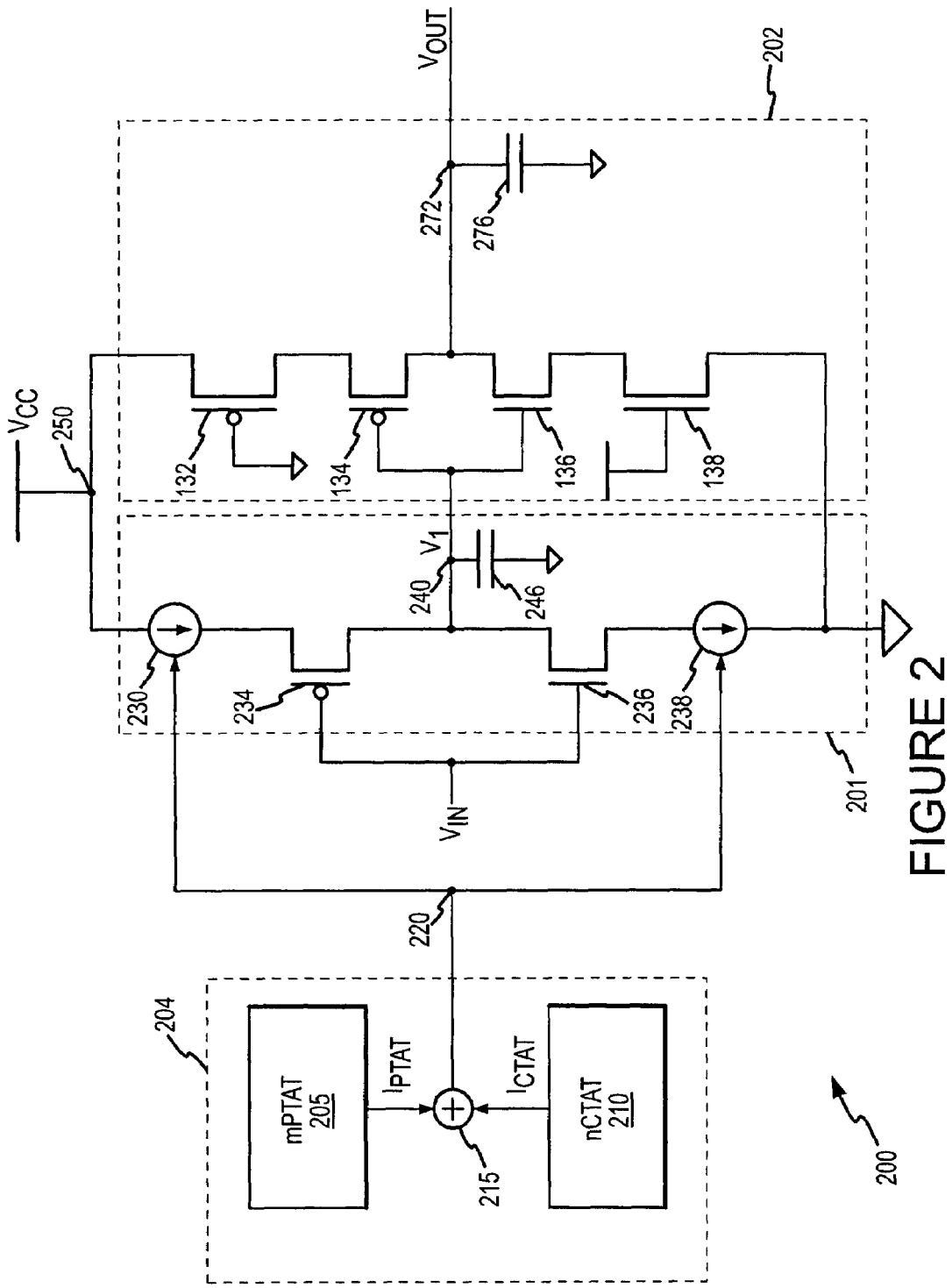
FIG. 2 is a schematic drawing of a delay circuit according to an embodiment of the present invention.

FIG. 2 shows a temperature and voltage compensated delay circuit 200 according to an embodiment of the invention. The compensated delay circuit 200 includes a constant current source 204 and two delay stages 201, 202. A constant current provided by the constant current source 204 is mirrored for sourcing or sinking a constant current to the first delay stage 201 when generating a delay signal. The constant current source 204 includes a temperature dependent current generator 205 of conventional design that generates a current $I_{PTAT}$ that is 'proportional to its absolute temperature' ("mPTAT"). The constant current source 204 also includes a inverse temperature dependent current generator 210 of conventional design that generates a current $I_{CTAT}$ that is 'complimentary to its absolute temperature' ("nCTAT"). The currents $I_{PTAT}$ and the $I_{CTAT}$ are summed at a summing node 215 so that the effect of temperature on each current are cancelled out, and the net effect (also known as the net temperature coefficient) is zero. As a result, the current provided to a circuit 220 is independent of temperature variations. Alternatively, relative weights "m" and "n" may be assigned to the $I_{PTAT}$ and $I_{CTAT}$ currents such that the sum of the currents, $mI_{PTAT}+nI_{CTAT}$, yields a higher or lower temperature coefficient to offset any temperature dependency to the second delay stage 202. Therefore, the constant current source 204 may be tuned by adjusting the temperature coefficients of the $I_{PTAT}$ and $I_{CTAT}$ currents, to ensure the total net effect of temperature on the compensated delay circuit 200 is zero. The temperature compensated current at node 220 are then mirrored for sourcing or sinking the constant current to the first delay stage 201 of the delay circuit 200.

The first delay stage 201 includes an inverter formed by a PMOS transistor 234 and an NMOS transistor 236 connected in series with a current source 230 and a current sink 238 between a supply voltage $V_{CC}$ (connected at node 250) and ground. Gates of the transistors 234, 236 are respectively connected to each other to receive an input signal $V_{IN}$. The current source 230 provides a constant current to the PMOS transistor 234 that is mirrored to the current $mI_{PTAT}+nI_{CTAT}$ and independent of $V_{CC}$. The current sink 238 sinks a current that also mirrors $mI_{PTAT}+nI_{CTAT}$. A capacitor 246 is connected to the output of the first delay stage 201 at a node 240.

Figure 1:
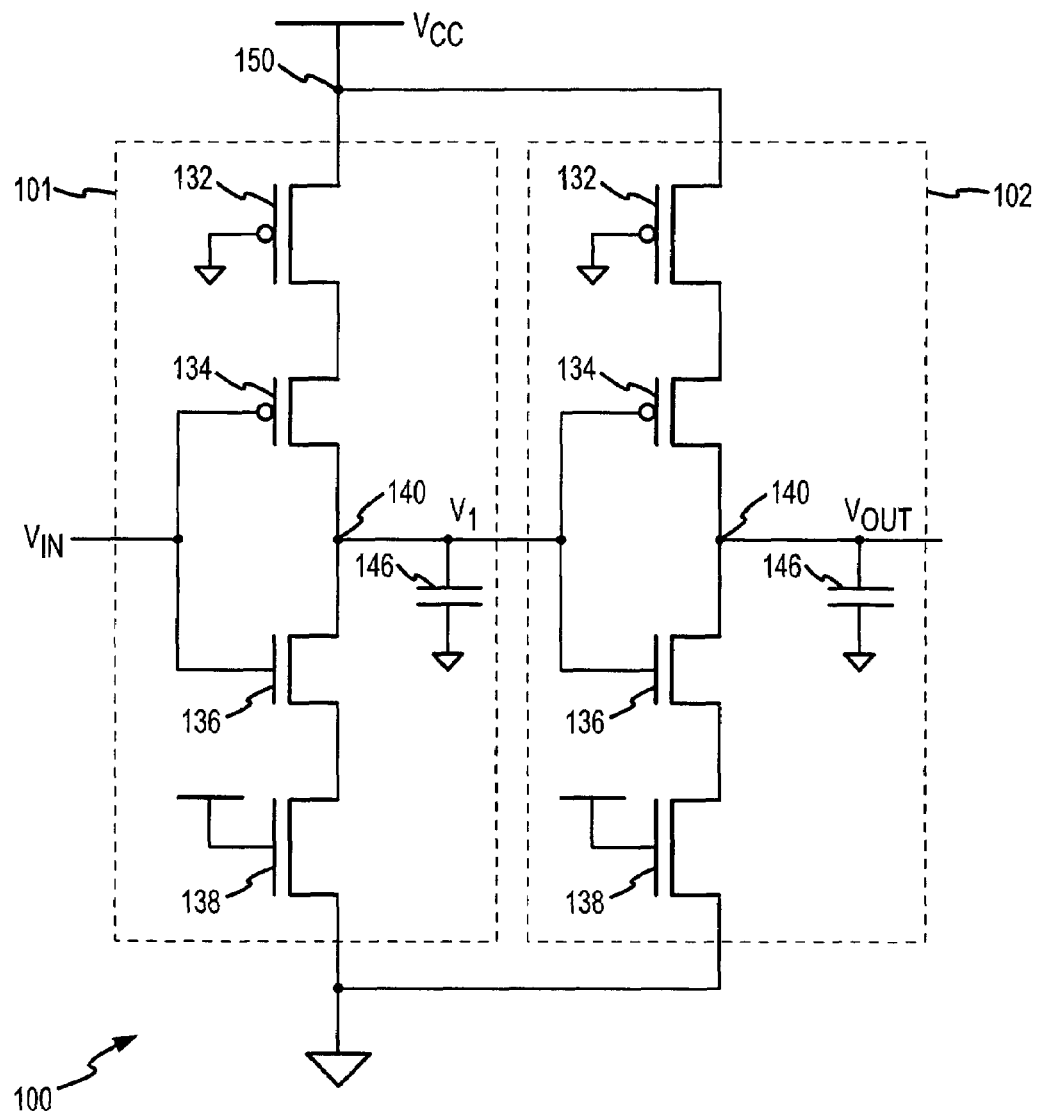
FIG. 1 is a schematic drawing of a conventional delay circuit using a series of inverters.

The first delay stage 201 operates in essentially the same manner as the first delay stage 101 of the delay circuit 100 of FIG. 1 except that the current source 230 provides a charge current to the capacitor 246 that is independent of changes in temperature. Similarly, the current sink 238 provides a discharge current to the capacitor 246 that is independent of changes in temperature. As a result, the delay of the first stage responsive to transitions of the $V_{IN}$ signal is independent of temperature.

The second delay stage 202 is identical to the first delay stage 102, and includes a series of two PMOS transistors 134, 132 and two NMOS transistors 136, 138 coupled between the supply voltage $V_{CC}$ (at the node 250) and ground. As in the first stage, the gates of the PMOS transistor 134 and the NMOS transistor 136 are connected to each other, but instead receive an input signal $V_1$ from the output of the first delay stage 201. Again, a capacitor 276 is connected to the output of the second delay stage 202 at an output node 272.

In operation, when the supply voltage $V_{CC}$ is increased, the current through the PMOS transistor 132 and the current through the NMOS transistor 138 will increase, charging and discharging the capacitor 276 at a faster rate. When the supply voltage $V_{CC}$ is decreased, the current through the PMOS transistor 132 and current through the NMOS transistor 138 will decrease, charging and discharging the capacitor 276 at a slower rate. This effect compensates for an increase or decrease in delay time generated at the first stage due to changes in the supply voltage $V_{CC}$, as will be explained in more detail below.

Figure 3A:
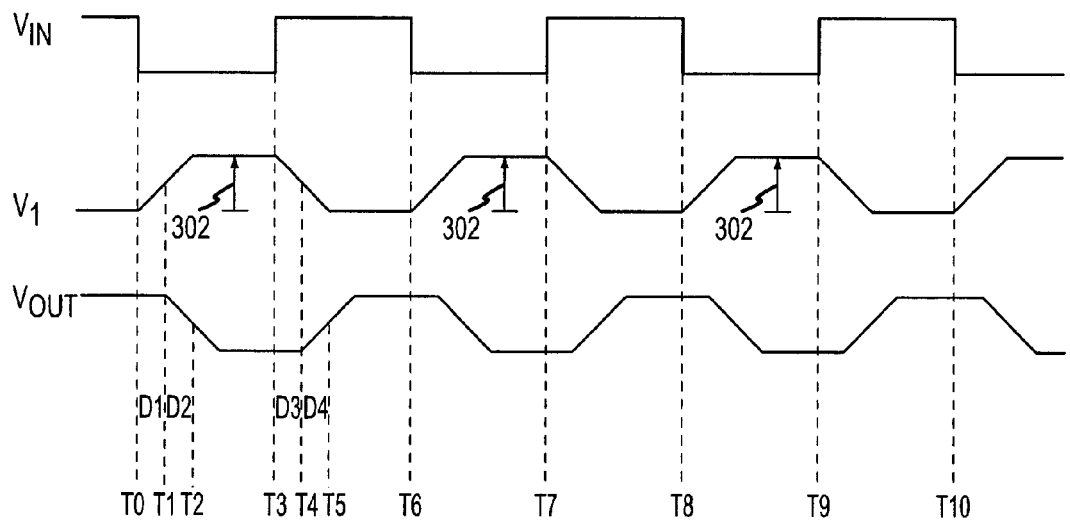
FIG. 3A is a timing diagram illustrating various signals generated during operation of the delay circuit of FIG. 2.

FIG. 3A is a timing diagram illustrating various signals generated during operation of the compensated delay circuit 200 of FIG. 2. The signal $V_{IN}$ is the input signal to the delay circuit 200, signal $V_1$ is the response at the output of the first delay stage 201, and signal $V_{OUT}$ is the response at the output of the second stage 202. Since each delay stage acts like an inverter, $V_{OUT}$ is complimentary to $V_1$ and $V_1$ is complimentary to $V_{IN}$. In response to a falling-edge of the input signal $V_{IN}$ at time T0, the PMOS transistor 234 is turned ON and the NMOS transistor 236 is turned OFF. As a result, the constant current from the current source 230 charges the first delay stage capacitor 246 towards $V_{CC}$ at a constant rate, driving the output signal $V_1$ towards a magnitude that is equal to $V_{CC}$. Arrows 302 correspond to the magnitude determined by the supply voltage $V_{CC}$. At time T1, which is delayed from T0 by a delay time of D1, the output voltage of $V_1$ from the first delay stage 201 has increased to approximately $V_{CC}/2$. The delay time D1 is determined by the magnitude of the current from the current source 230 and the capacitance of the capacitor 246. By the time output the voltage of $V_1$ reaches $V_{CC}/2$ at time T1, the capacitor 276 has begun to discharge through the NMOS transistor 138, and the output voltage $V_{OUT}$ from the second delay stage 202 reaches $V_{CC}/2$ after a delay of D2 at time T2. The delay time D2 is determined by the magnitude of the supply voltage $V_{CC}$, the impedance of the NMOS transistor 138, and the capacitance of the capacitor 276. In response to the rising-edge of the input signal $V_{IN}$ at time T3, the output voltage of $V_1$ from the first delay stage 201 begins to fall and reaches approximately $V_{CC}/2$ at time T4 after a delay from T3 of D3. The delay time D3 is determined by the magnitude of the current drawn by the current sink 238 and the capacitance of the capacitor 246. If the current from the current source 230 is equal to the current drawn by the current sink 238, the delay time D3 will be equal to the delay time D1. Insofar as the current from the current source 230 and the current drawn by the current sink 238 are insensitive to temperature, the delay times D1 and D3 will also be insensitive to temperature. Finally, when the voltage of $V_1$ falls to approximately $V_{CC}/2$ at time T4, the output voltage $V_{OUT}$ from the second stage 202 has begun to increasing and reaches $V_{CC}/2$ after a delay of D4 at time T5. The delay time D4 is determined by the magnitude of the supply voltage $V_{CC}$, the impedance of the PMOS transistor 132, and the capacitance of the capacitor 276. If the impedance of the PMOS transistor 132 is equal to the impedance of the NMOS transistor 138, then the delay time D4 will be equal to the delay time D2. The total delay of the delay circuit 200 in response to the falling edge of $V_{IN}$ is the sum of the delay times D1 and D2, and the total delay of the delay circuit 200 in response to the rising edge of $V_{IN}$ is the sum of the delay times D3 and D4. The total delay is generated again in the same manner for each period of the input signal $V_{IN}$ in response to rising edges at times T7 and T9, and at falling edges at times T6, T8 and T10, respectively.

Figure 3B:
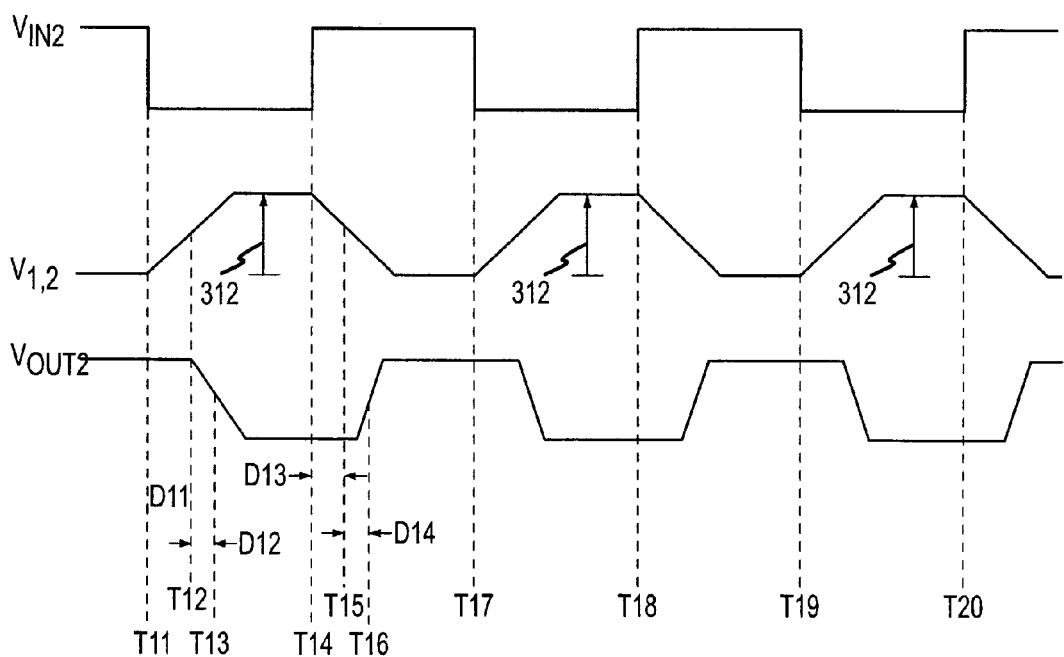
FIG. 3B is a timing diagram illustrating various signals generated during operation of the delay circuit of FIG. 2 when the supply voltage has increased.

FIG. 3B is a signal timing diagram illustrating various signals generated during operation of the delay circuit 200 of FIG. 2 when the supply voltage $V_{CC}$ has increased. As in FIG. 3A, a signal $V_{IN2}$ is the input signal to the delay circuit 200, a signal $V_{1,2}$ is the response signal of the first delay stage 201, and a signal $V_{OUT2}$ is the output of the second stage 202. In response to a falling-edge of the input signal $V_{IN2}$ at time T11, the PMOS transistor 234 is turned on and the constant current from the current source 230 charges the first delay stage capacitor 246 towards $V_{CC}$. The current for the first delay stage 201 is independent of the magnitude of the supply voltage $V_{CC}$, and therefore the capacitor 246 is charged at the same rate in the examples of both FIG. 3A and FIG. 3B. However, in the example of FIG. 3B, the charging capacitor 246 drives the output voltage of $V_{1,2}$ towards a higher $V_{CC}$ corresponding to the magnitude of arrows 312. Consequently, it takes more time to charge the capacitor 246 to approximately $V_{CC}/2$ at time T12, thereby increasing the delay of the first delay stage 201 from D1 to D11. As in FIG. 3A, when the voltage of $V_{1,2}$ reaches approximately $V_{CC}/2$, the PMOS transistor 134 of the second delay stage 202 is turned OFF and the NMOS transistor 136 is turned ON. As a result, the output signal $V_{OUT}$ begins to fall at time T12 as the capacitor 276 is discharged through the NMOS transistor 138. However, since the capacitor 276 in the example of FIG. 3B was charged to a voltage $V_{CC}/2$ that is larger than the voltage $V_{CC}/2$ to which the capacitor 276 was charged in the example of FIG. 3A, the current discharging the capacitor 276 is greater in the example of FIG. 3B. As a result, the delay time D12 required for the capacitor 276 to discharge to approximately $V_{CC}/2$ at time T13 is smaller than the delay time D2 required for the capacitor 276 to discharge to approximately $V_{CC}/2$ at time T2 in the example of FIG. 3A. This decreased delay time of D12 resulting from the increase in the supply voltage $V_{CC}$ compensates for the increased delay time of D11. The total delay time D11+D12 is therefore insensitive to changes in the supply voltage $V_{CC}$.

In a similar manner, the increase in the input voltage $V_{IN2}$ at time T14 causes the capacitor 246 to be discharged by the current drawn by the current sink 238 to approximately $V_{CC}/2$ at time T15. Insofar as the discharge rate of the capacitor 246 is insensitive to the supply voltage yet the capacitor 246 having to be discharged from a larger voltage $V_{CC}$ in the example of FIG. 3B, the delay time D13 is longer than the delay time D3 in the example of FIG. 3A. By the time the voltage of $V_{1,2}$ falls to $V_{CC}/2$, the capacitor 276 has begun to charge through the PMOS transistor 134. However, since the supply voltage $V_{CC}$ is larger in the example of FIG. 3B, the current charging the capacitor 276 is greater in the example of FIG. 3B. As a result, the voltage $V_{OUT2}$ reaches approximately $V_{CC}/2$ at time T16 more quickly than the voltage $V_{OUT}$ reaches $V_{CC}/2$ at time T5 in the example of FIG. 3A, thereby making the delay time D14 shorter than the delay time D4. This decreased delay time of D14 resulting from the increase in the supply voltage $V_{CC}$ compensates for the increased delay time of D13. The total delay time D13+D14 is therefore also insensitive to changes in the supply voltage $V_{CC}$. The total delay is generated again in the same manner for each period of the input signal $V_{IN2}$ in response to rising edges at times T18 and T20, and at falling edges at times T17 and T19, respectively.

A total constant delay is provided independent of temperature and voltage by using both delay stages 201, 202 in the delay circuit 200. The constant current of the first delay stage 201 is independent of temperature, while the effects of the first delay stage 201 due to the change in supply voltage is compensated by the effects of the second delay stage 202 as previously described. The total delay provided by the delay circuit 200 may then be controlled by controlling the amount of current to each of the delay stages. The constant current to the first delay stage 201 is controlled by the PTAT circuit 205 and CTAT circuit 210, and may be adjusted accordingly. The current to the second delay stage 202 is controlled by changing the channel length of the PMOS transistor 132 and the NMOS transistor 138 to vary the resistance. However, to properly provide a constant total delay independent of temperature and voltage, the coefficient delay of the first delay stage 201 preferably should match the coefficient delay of the second delay stage 202.

Figure 4:
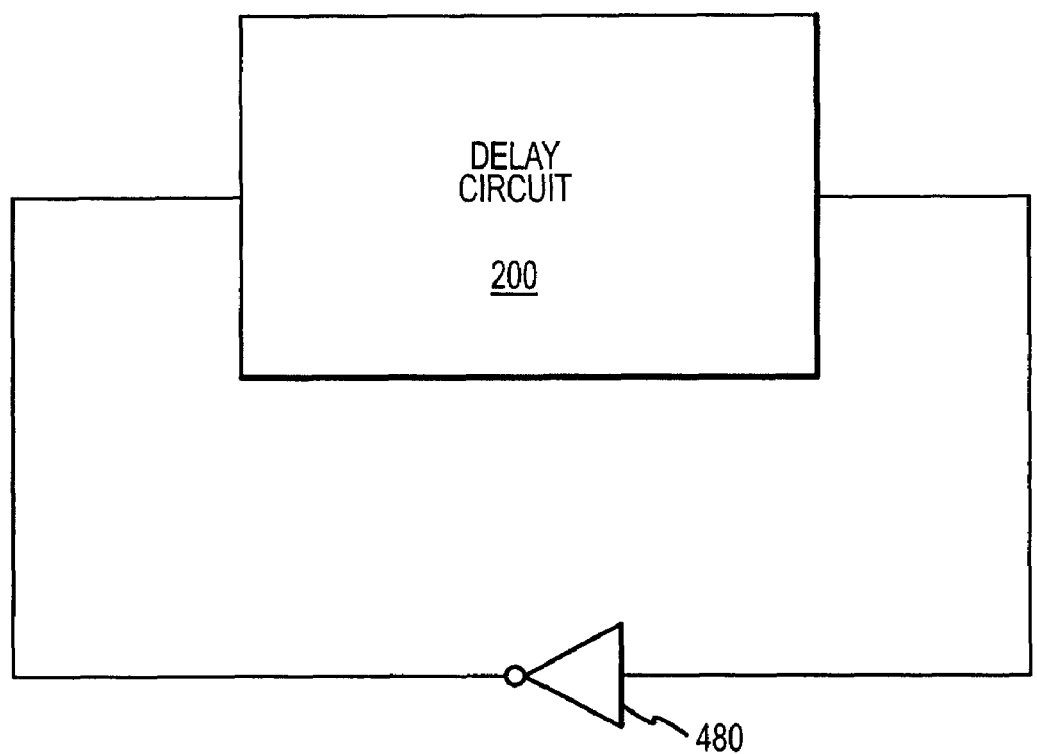
FIG. 4 is a schematic drawing of a delay circuit according to another embodiment of the present invention.
Figure 4:

One embodiment of the delay circuit 200 of FIG. 2 is provided in an oscillator 400 shown in FIG. 4. The oscillator 400 includes the delay circuit 200 that is identical to the delay circuit 200 shown in FIG. 2. The output of the delay circuit 200 is coupled to the input of the delay circuit 200 by a conventional inverter 480. As previously explained, the delay of the delay circuit 200 is substantially independent of changes in temperature and the supply voltage $V_{CC}$. As a result, the oscillator 400 generates a periodic signal having a frequency that is independent of temperature and voltage.

Figure 5:
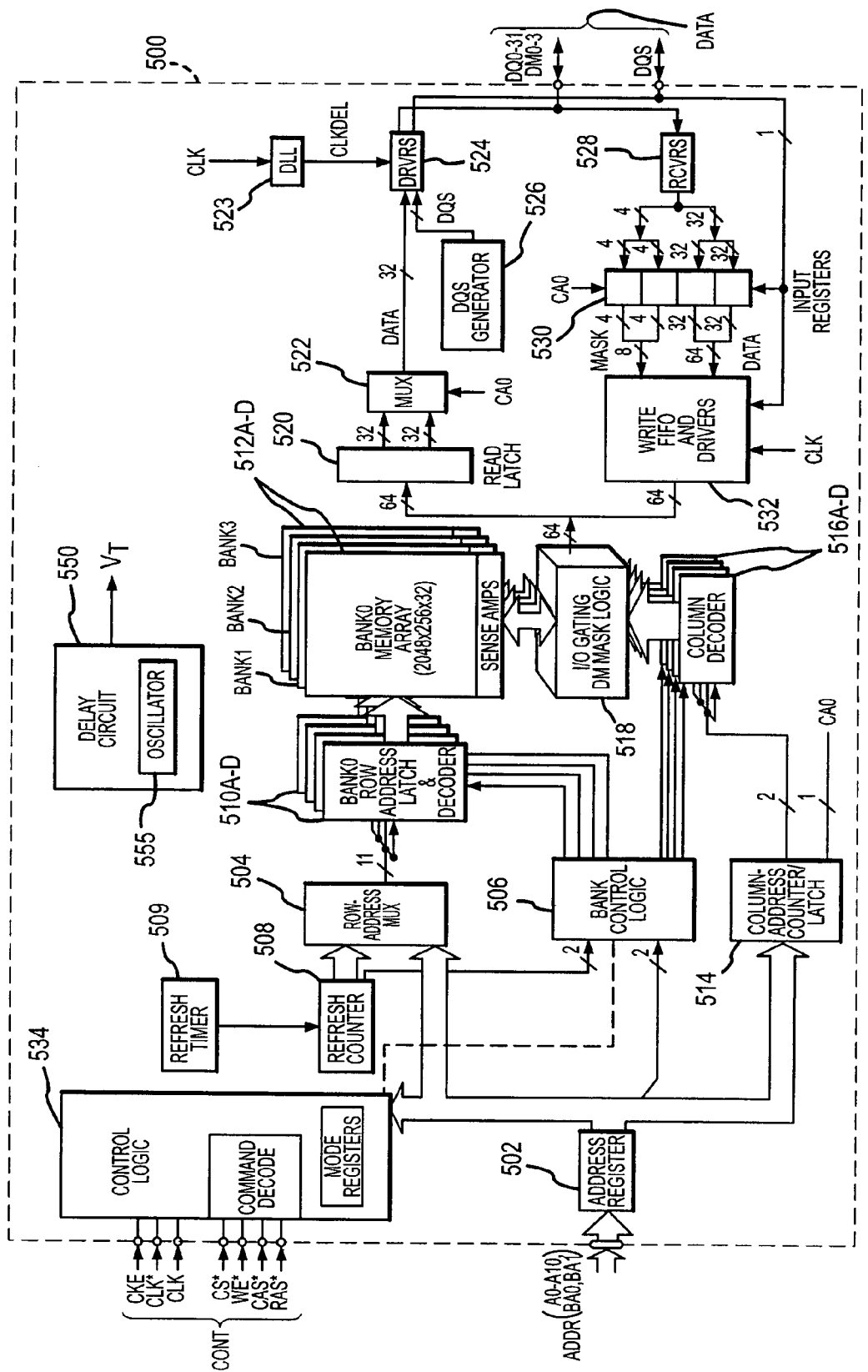
FIG. 5 is a functional block diagram illustrating a synchronous memory device including a delay circuit according to an embodiment of the present invention.

FIG. 5 is a functional block diagram of a memory device 500 including one or more of the temperature and voltage compensated delay circuit 200 of FIG. 2 and/or the oscillator 400 of FIG. 4. The memory device 500 in FIG. 5 is a double-data rate (DDR) synchronous dynamic random access memory ("SDRAM"), although the principles described herein are applicable to any memory device that may include a delay-locked loop for synchronizing internal and external signals, such as conventional synchronous DRAMs (SDRAMs), as well as packetized memory devices like SLDRAMs and RDRAMs, and are equally applicable to any integrated circuit that must synchronize internal and external clocking signals.

The memory device 500 includes an address register 502 that receives row, column, and bank addresses over an address bus ADDR, with a memory controller (not shown) typically supplying the addresses. The address register 502 receives a row address and a bank address that are applied to a row address multiplexer 504 and bank control logic circuit 506, respectively. The row address multiplexer 504 applies either the row address received from the address register 502 or a refresh row address from a refresh counter 508 to a plurality of row address latch and decoders 510A-D. The bank control logic 506 activates the row address latch and decoder 510A-D corresponding to either the bank address received from the address register 502 or a refresh bank address from the refresh counter 508, and the activated row address latch and decoder latches and decodes the received row address. The bank control logic 506 may include delay elements such as the delay circuit 200 to provide constant delays for controlling the timing of signals coupled through the row address path and the column address path. The bank control logic 506 may also require additional delays to properly execute precharge commands received by a lockout circuit included in the bank control logic 506. A refresh timer 509 may be coupled to the refresh counter 508 to synchronize refresh operations with the decoders 510A-D and the bank control logic 506. The refresh timer 509 may include the oscillator 400 for providing a time base that is used to increment the refresh counter 508.

In response to the decoded row address, the activated row address latch and decoder 510A-D applies various signals to a corresponding memory bank 512A-D to thereby activate a row of memory cells corresponding to the decoded row address. Each memory bank 512A-D includes a memory-cell array having a plurality of memory cells arranged in rows and columns, and the data stored in the memory cells in the activated row is stored in sense amplifiers in the corresponding memory bank. The row address multiplexer 504 applies the refresh row address from the refresh counter 508 to the decoders 510A-D and the bank control logic circuit 506 uses the refresh bank address from the refresh counter 508 when the memory device 500 operates in an auto-refresh or self-refresh mode of operation in response to an auto- or self-refresh command being applied to the memory device 500, as will be appreciated by those skilled in the art.

A column address is applied on the ADDR bus after the row and bank addresses, and the address register 502 applies the column address to a column address counter and latch 514 which, in turn, latches the column address and applies the latched column address to a plurality of column decoders 516A-D. The bank control logic 506 activates the column decoder 516A-D corresponding to the received bank address, and the activated column decoder decodes the applied column address. Depending on the operating mode of the memory device 500, the column address counter and latch 514 either directly applies the latched column address to the decoders 516A-D, or applies a sequence of column addresses to the decoders starting at the column address provided by the address register 502. In response to the column address from the counter and latch 514, the activated column decoder 516A-D applies decode and control signals to an I/O gating and data masking circuit 518 which, in turn, accesses memory cells corresponding to the decoded column address in the activated row of memory cells in the memory bank 512A-D being accessed. The I/O gating and data masking circuit 518 may include delay elements such as the delay circuit 200 to provide constant delays during read and write operations. For example, delays may be used to facilitate data sense amplifiers during data read operations to maintain the order in which the read data are received or delays may be used by write drivers to keep track of write data as they arrive during data write operations.

During data read operations, data being read from the addressed memory cells is coupled through the I/O gating and data masking circuit 518 to a read latch 520. The I/O gating and data masking circuit 518 supplies N bits of data to the read latch 520, which then applies two N/2 bit words to a multiplexer 522. The read latch 520 may also contain the delay circuit 200 of FIG. 2 to delay a clock signal to align a transition of a clock signal to the center of the period where the data applied to the latch is valid. A data driver 524 sequentially receives the N/2 bit words from the multiplexer 522 and also receives a data strobe signal DQS from a strobe signal generator 526 and a delayed clock signal CLKDEL from the delay-locked loop 523. The DQS signal is used by an external circuit such as a memory controller (not shown) in latching data from the memory device 500 during read operations. In response to the delayed clock signal CLKDEL, the data driver 524 sequentially outputs the received N/2 bits words as a corresponding data word DQ, each data word being output in synchronism with a rising or falling edge of a CLK signal that is applied to clock the memory device 500. If the data driver 524 includes multiple driver circuits, the delay circuit 200 can be used to enable the driver circuits at different times to control the slew rate of a signal output from the data driver 524. The data driver 524 also outputs the data strobe signal DQS having rising and falling edges in synchronism with rising and falling edges of the CLK signal, respectively. Each data word DQ and the data strobe signal DQS collectively define a data bus DATA. As will be appreciated by those skilled in the art, the CLKDEL signal from the delay-locked loop 523 is a delayed version of the CLK signal, and the delay-locked loop 523 adjusts the delay of the CLKDEL signal relative to the CLK signal to ensure that the DQS signal and the DQ words are placed on the DATA bus in synchronism with the CLK signal. The delay-locked loop 523 may include the delay circuit 200 to provide the delay of the CLKDEL signal. The DATA bus also includes masking signals DM0-M, which will be described in more detail below with reference to data write operations.

During data write operations, an external circuit such as a memory controller (not shown) applies N/2 bit data words DQ, the strobe signal DQS, and corresponding data masking signals DM0-X on the data bus DATA. A data receiver 528 receives each DQ word and the associated DM0-X signals, and applies these signals to input registers 530 that are clocked by the DQS signal. In response to a rising edge of the DQS signal, the input registers 530 latch a first N/2 bit DQ word and the associated DM0-X signals, and in response to a falling edge of the DQS signal the input registers latch the second N/2 bit DQ word and associated DM0-X signals. The input register 530 provides the two latched N/2 bit DQ words as an N-bit word to a write FIFO and driver 532, which clocks the applied DQ word and DM0-X signals into the write FIFO and driver in response to the DQS signal. The DQ word is clocked out of the write FIFO and driver 532 in response to the CLK signal, and is applied to the I/O gating and masking circuit 518. The I/O gating and masking circuit 518 transfers the DQ word to the addressed memory cells in the accessed bank 512A-D subject to the DM0-X signals, which may be used to selectively mask bits or groups of bits in the DQ words (i.e., in the write data) being written to the addressed memory cells.

A control logic and command decoder 534 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signals CLK, CLK*, the command decoder 534 latches and decodes an applied command, and generates a sequence of clocking and control signals that control the components 502-532 to execute the function of the applied command. The clock enable signal CKE enables clocking of the command decoder 534 by the clock signals CLK, CLK*. The command decoder 534 latches command and address signals at positive edges of the CLK, CLK* signals (i.e., the crossing point of CLK going high and CLK* going low), while the input registers 530 and data drivers 524 transfer data into and from, respectively, the memory device 500 in response to both edges of the data strobe signal DQS and thus at double the frequency of the clock signals CLK, CLK*. This is true because the DQS signal has the same frequency as the CLK, CLK* signals. The memory device 500 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 534 in generating the control and timing signals is conventional, and thus, for the sake of brevity, will not be described in more detail.

Additionally, the memory device 500 may also include a delay circuit 550 that may be used to provide temperature and voltage insensitive delays of internal signals. As a result, the timing of internal operations can be substantially insensitive to variations in temperature and supply voltage. The delay circuit 550 may also be used in an oscillator 555 to provide a periodic clock signal having a frequency that is substantially insensitive to variations in temperature and supply voltage. For example, the oscillator 555 may be used to control the refresh timer 509 to make the intervals between refresh operations substantially insensitive to variations in temperature and supply voltage.

Figure 6:
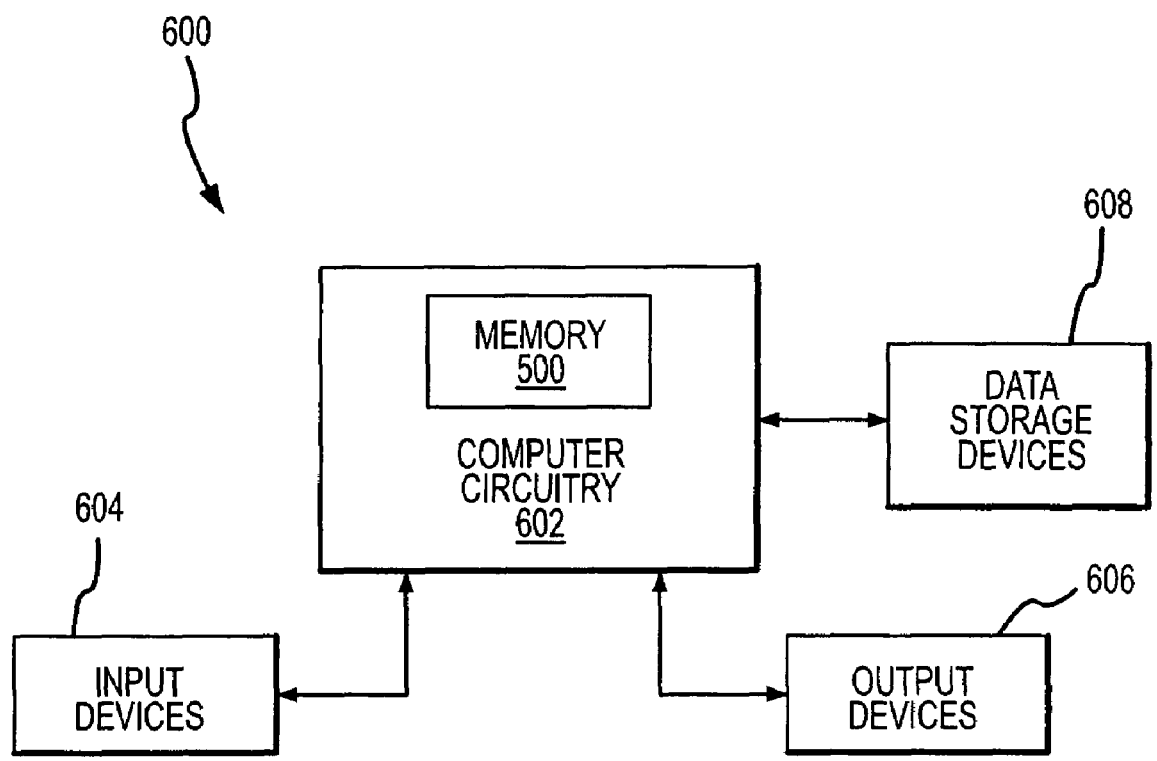
FIG. 6 is a functional block diagram illustrating a computer system including the synchronous memory device of FIG. 5.

FIG. 6 is a block diagram of a computer system 600 including computer circuitry 602 including the memory device 500 of FIG. 5. Typically, the computer circuitry 602 is coupled through address, data, and control buses to the memory device 500 to provide for writing data to and reading data from the memory device. The computer circuitry 602 includes circuitry for performing various computing functions, such as executing specific software to perform specific calculations or tasks. In addition, the computer system 600 includes one or more input devices 604, such as a keyboard or a mouse, coupled to the computer circuitry 602 to allow an operator to interface with the computer system. Typically, the computer system 600 also includes one or more output devices 606 coupled to the computer circuitry 602, such as output devices typically including a printer and a video terminal. One or more data storage devices 608 are also typically coupled to the computer circuitry 602 to store data or retrieve data from external storage media (not shown). Examples of typical storage devices 608 include hard and floppy disks, tape cassettes, compact disk read-only (CD-ROMs) and compact disk read-write (CD-RW) memories, and digital video disks (DVDs).

From the foregoing it will be appreciated that, although specific embodiments of the invention have been described herein for purposes of illustration, various modifications may be made without deviating from the spirit and scope of the invention. For example, many of the components described above may be implemented using either digital or analog circuitry, or a combination of both. Accordingly, the invention is not limited except as by the appended claims.

What is claimed is:

1. A delay circuit comprising:
a voltage supply;
a first delay stage coupled to receive a supply voltage from the voltage supply, the first delay stage being operable to receive an input signal and generate a delayed output signal from the input signal, the magnitude of the delay of the delayed output signal being proportional to the magnitude of the supply voltage; and
a second delay stage coupled to receive the delayed output signal of the first delay stage and further coupled to receive the supply voltage from the voltage supply, the second delay stage operable to generate a second delayed signal from the delayed output signal of the first delay stage, the magnitude of the delay of the second delayed signal being inversely proportional to the magnitude of the supply voltage to substantially the same degree that the delayed output signal of the first delay stage is proportional to the magnitude of the supply voltage.

2. The delay circuit of claim 1 wherein the first delay stage further comprises a current source and a current sink, the first delay stage being further configured to generate the delayed output signal by charging a capacitor to a predetermined percent of the supply voltage at a constant current provided by the current source or discharging a capacitor from the predetermined percent of the supply voltage by sinking a constant current provided by the current sink.

3. The delay circuit of claim 2 wherein the predetermined percent of the supply voltage is 50%.

4. The delay circuit of claim 1 wherein the second delay stage further comprises at least one transistor coupled to the supply voltage and a capacitor, the at least one transistor having an elongated channel between its drain and source to provide a resistance for driving a current proportional to the supply voltage, the current proportional to the supply voltage being the charge or discharge current for the capacitor when providing the delay for the second delayed signal.

5. The delay circuit of claim 1 wherein each of the first and second delay stages further comprises respective inverters, each inverter having two transistors coupled to a capacitor, the first transistor being coupled between the voltage supply and the capacitor and the second transistor being coupled between the capacitor and a second voltage supply respectively.

6. The delay circuit of claim 5 further comprising at least one additional inverter coupled to the second delay stage for providing additional delay stages, the at least one inverter having two transistors coupled to a capacitor, the first transistor being coupled between the voltage supply and the capacitor and the second transistor being coupled between the capacitor and the second voltage supply respectively.

7. An oscillator having a delay circuit comprising:
a voltage supply;
a first delay stage coupled to receive a supply voltage from the voltage supply, the first delay stage being operable to receive an input signal and generate a delayed output signal from the input signal, the magnitude of the delay of the delayed output signal being proportional to the magnitude of the supply voltage;
a second delay stage coupled to receive the delayed output signal of the first delay stage and further coupled to receive the supply voltage from the voltage supply, the second delay stage operable to generate a second delayed signal from the delayed output signal of the first delay stage, the magnitude of the delay of the second delayed signal being inversely proportional to the magnitude of the supply voltage to substantially the same degree that the delayed output signal of the first delay stage is proportional to the magnitude of the supply voltage; and
a feedback circuit coupled to the output of the second delay stage and the input of the first delay stage, the feedback circuit and the delay circuit collectively providing an odd number of inversions.

8. The delay circuit of claim 7 wherein the first delay stage further comprises a current source and a current sink, the first delay stage being further configured to generate the delayed output signal by charging a capacitor to a predetermined percent of the supply voltage at a constant current provided by the current source or discharging a capacitor from the predetermined percent of the supply voltage by sinking a constant current provided by the current sink.

9. The delay circuit of claim 8 wherein the predetermined percent of the supply voltage is 50%.

10. The delay circuit of claim 7 wherein the second delay stage further comprises at least one transistor coupled to the supply voltage and a capacitor, the at least one transistor having an elongated channel between its drain and source to provide a resistance for driving a current proportional to the supply voltage, the current proportional to the supply voltage being the charge or discharge current for the capacitor when providing the delay for the second delayed signal.

11. The delay circuit of claim 7 wherein each of the first and second delay stages further comprises respective inverters, each inverter having two transistors coupled to a capacitor, the first transistor being coupled between the voltage supply and the capacitor and the second transistor being coupled between the capacitor and a second voltage supply respectively.

12. The delay circuit of claim 11 further comprising at least one additional inverter coupled to the second delay stage for providing additional delay stages, the at least one inverter having two transistors coupled to a capacitor, the first transistor being coupled between the voltage supply and the capacitor and the second transistor being coupled between the capacitor and the second voltage supply respectively.

13. A delay circuit comprising:
a voltage supply;
a reference current circuit operable to provide a constant current insensitive to temperature variations;
a first delay stage coupled to receive a supply voltage from the voltage supply, and further coupled to receive the constant current from the reference current circuit, the first delay stage being operable to receive an input signal and generate a delayed output signal from the input signal, the delay time of the delayed output signal being determined by the time it takes to charge a capacitor by the constant current to a predetermined percent of the supply voltage; and
a second delay stage coupled to receive the delayed output signal of the first delay stage and further coupled to receive the supply voltage from the voltage supply, the second delay stage operable to generate a second delayed signal from the delayed output signal of the first delay stage, the delay time of the second delayed signal being inversely proportional to the magnitude of the supply voltage to substantially the same degree the delay time of the first delay stage is proportional to the magnitude of the supply voltage.

14. The delay circuit of claim 13 wherein the reference current circuit comprises:
a temperature dependent current generator structured to provide a first current proportional to absolute temperature;
an inverse temperature dependent current generator structured to provide a second current complimentary to absolute temperature; and
a current summer structured to sum the first current and the second current to generate a total current having a net temperature coefficient of zero.

15. The delay circuit of claim 13 wherein the predetermined percent of the supply voltage is 50%.

16. The delay circuit of claim 13 wherein the first delay stage further comprises a current source and a current sink each of which are respectively coupled to the reference current circuit, the first delay stage being further configured to generate the delayed output signal by charging a capacitor at a constant current provided by the current source or discharging a capacitor by sinking a constant current provided by the current sink.

17. The delay circuit of claim 13 wherein the second delay stage further comprises at least one transistor coupled to the supply voltage and a capacitor, the at least one transistor having an elongated channel between its drain and source to provide a resistance for driving a current proportional to the supply voltage, the current proportional to the supply voltage being the charge or discharge current for the capacitor when providing the delay for the second delayed signal.

18. The delay circuit of claim 13 wherein each of the first and second delay stages further comprises respective inverters, each inverter having two transistors coupled to a capacitor, the first transistor being coupled between the voltage supply and the capacitor and the second transistor being coupled between the capacitor and a second voltage supply respectively.

19. The delay circuit of claim 18 further comprising at least one additional inverter coupled to the second delay stage for providing additional delay stages, the at least one inverter having two transistors coupled to a capacitor, the first transistor being coupled between the voltage supply and the capacitor and the second transistor being coupled between the capacitor and the second voltage supply respectively.

20. A memory device, comprising:
an address bus;
a control bus;
a data bus;
an address decoder coupled to the address bus;
a read/write circuit coupled to the control bus;
a memory-cell array coupled to the address decoder, control circuit, and read/write circuit; and
a delay circuit coupled to at least the control circuit, the delay circuit comprising:
a voltage supply;
a first delay stage coupled to receive a supply voltage from the voltage supply, the first delay stage being operable to receive an input signal and generate a delayed output signal from the input signal, the magnitude of the delay of the delayed output signal being proportional to the magnitude of the supply voltage; and
a second delay stage coupled to receive the delayed output signal of the first delay stage and further coupled to receive the supply voltage from the voltage supply, the second delay stage operable to generate a second delayed signal from the delayed output signal of the first delay stage, the magnitude of the delay of the second delayed signal being inversely proportional to the magnitude of the supply voltage to substantially the same degree that the delayed output signal of the first delay stage is proportional to the magnitude of the supply voltage.

21. The memory device of claim 20 wherein the first delay stage of the delay circuit further comprises a current source and a current sink, the first delay stage being further configured to generate the delayed output signal by charging a capacitor to a predetermined percent of the supply voltage at a constant current provided by the current source or discharging a capacitor from the predetermined percent of the supply voltage by sinking a constant current provided by the current sink.

22. The memory device of claim 20 wherein the predetermined percent of the supply voltage is 50%.

23. The memory device of claim 20 wherein the second delay stage of the delay circuit further comprises at least one transistor coupled to the supply voltage and a capacitor, the at least one transistor having an elongated channel between its drain and source to provide a resistance for driving a current proportional to the supply voltage, the current proportional to the supply voltage being the charge or discharge current for the capacitor when providing the delay for the second delayed signal.

24. The memory device of claim 20 wherein each of the first and second delay stages of the delay circuit further comprises respective inverters, each inverter having two transistors coupled to a capacitor, the first transistor being coupled between the voltage supply and the capacitor and the second transistor being coupled between the capacitor and a second voltage supply respectively.

25. The memory device of claim 24 wherein the delay circuit further comprising at least one additional inverter coupled to the second delay stage for providing additional delay stages, the at least one inverter having two transistors coupled to a capacitor, the first transistor being coupled between the voltage supply and the capacitor and the second transistor being coupled between the capacitor and the second voltage supply respectively.

26. A memory device, comprising:
an address bus;
a control bus;
a data bus;
an address decoder coupled to the address bus;
a read/write circuit coupled to the control bus;
a memory-cell array coupled to the address decoder, control circuit, and read/write circuit; and
a delay circuit coupled to at least the control circuit, the delay circuit comprising:
a voltage supply;
a reference current circuit operable to provide a constant current insensitive to temperature variations;
a first delay stage coupled to receive a supply voltage from the voltage supply, and further coupled to receive the constant current from the reference current circuit, the first delay stage being operable to receive an input signal and generate a delayed output signal from the input signal, the delay time of the delayed output signal being determined by the time it takes to charge a capacitor by the constant current to a predetermined percent of the supply voltage; and
a second delay stage coupled to receive the delayed output signal of the first delay stage and further coupled to receive the supply voltage from the voltage supply, the second delay stage operable to generate a second delayed signal from the delayed output signal of the first delay stage, the delay time of the second delayed signal being inversely proportional to the magnitude of the supply voltage to substantially the same degree the delay time of the first delay stage is proportional to the magnitude of the supply voltage.

27. The memory device of claim 26 wherein the reference current circuit of the delay circuit comprises:
a temperature dependent current generator structured to provide a first current proportional to absolute temperature;
an inverse temperature dependent current generator structured to provide a second current complimentary to absolute temperature; and
a current summer structured to sum the first current and the second current to generate a total current having a net temperature coefficient of zero.

28. The memory device of claim 26 wherein the predetermined percent of the supply voltage is 50%.

29. The memory device of claim 26 wherein the first delay stage of the delay circuit further comprises a current source and a current sink each of which are respectively coupled to the reference current circuit, the first delay stage being further configured to generate the delayed output signal by charging a capacitor at a constant current provided by the current source or discharging a capacitor by sinking a constant current provided by the current sink.

30. The memory device of claim 26 wherein the second delay stage of the delay circuit further comprises at least one transistor coupled to the supply voltage and a capacitor, the at least one transistor having an elongated channel between its drain and source to provide a resistance for driving a current proportional to the supply voltage, the current proportional to the supply voltage being the charge or discharge current for the capacitor when providing the delay for the second delayed signal.

31. The memory device of claim 26 wherein each of the first and second delay stages of the delay circuit further comprises respective inverters, each inverter having two transistors coupled to a capacitor, the first transistor being coupled between the voltage supply and the capacitor and the second transistor being coupled between the capacitor and a second voltage supply respectively.

32. The memory device of claim 31 wherein the delay circuit further comprising at least one additional inverter coupled to the second delay stage for providing additional delay stages, the at least one inverter having two transistors coupled to a capacitor, the first transistor being coupled between the voltage supply and the capacitor and the second transistor being coupled between the capacitor and the second voltage supply respectively.

33. A computer system, comprising:
a data input device;
a data output device;
a processor coupled to the data input and output devices; and
a memory device coupled to the processor, comprising:
an address bus;
a control bus;
a data bus;
an address decoder coupled to the address bus;
a read/write circuit coupled to the control bus;
a memory-cell array coupled to the address decoder, control circuit, and read/write circuit; and
a delay circuit coupled to at least the control circuit, the delay circuit comprising:
a voltage supply;
a first delay stage coupled to receive a supply voltage from the voltage supply, the first delay stage being operable to receive an input signal and generate a delayed output signal from the input signal, the magnitude of the delay of the delayed output signal being proportional to the magnitude of the supply voltage; and
a second delay stage coupled to receive the delayed output signal of the first delay stage and further coupled to receive the supply voltage from the voltage supply, the second delay stage operable to generate a second delayed signal from the delayed output signal of the first delay stage, the magnitude of the delay of the second delayed signal being inversely proportional to the magnitude of the supply voltage to substantially the same degree that the delayed output signal of the first delay stage is proportional to the magnitude of the supply voltage.

34. The computer system of claim 33 wherein the first delay stage of the delay circuit further comprises a current source and a current sink, the first delay stage being further configured to generate the delayed output signal by charging a capacitor to a predetermined percent of the supply voltage at a constant current provided by the current source or discharging a capacitor from the predetermined percent of the supply voltage by sinking a constant current provided by the current sink.

35. The computer system of claim 33 wherein the predetermined percent of the supply voltage is 50%.

36. The memory device of claim 33 wherein the second delay stage of the delay circuit further comprises at least one transistor coupled to the supply voltage and a capacitor, the at least one transistor having an elongated channel between its drain and source to provide a resistance for driving a current proportional to the supply voltage, the current proportional to the supply voltage being the charge or discharge current for the capacitor when providing the delay for the second delayed signal.

37. The memory device of claim 33 wherein each of the first and second delay stages of the delay circuit further comprises respective inverters, each inverter having two transistors coupled to a capacitor, the first transistor being coupled between the voltage supply and the capacitor and the second transistor being coupled between the capacitor and a second voltage supply respectively.

38. The memory device of claim 33 wherein the delay circuit further comprising at least one additional inverter coupled to the second delay stage for providing additional delay stages, the at least one inverter having two transistors coupled to a capacitor, the first transistor being coupled between the voltage supply and the capacitor and the second transistor being coupled between the capacitor and the second voltage supply respectively.

39. A method for providing a delayed signal, the method comprising:
receiving a supply voltage and an input signal;
generating a delayed output signal from the input signal, the magnitude of the delay of the delayed output signal being proportional to the magnitude of the supply voltage;
generating a second delayed signal from the delayed output signal, the magnitude of the delay of the second delayed signal being inversely proportional to the magnitude of the supply voltage.

40. The method of claim 39 wherein the magnitude of the delay of the second delayed signal is inversely proportional to the magnitude of the supply voltage to substantially the same degree that the delayed output signal is proportional to the magnitude of the supply voltage.

41. The method of claim 39 wherein generating the delayed output signal further comprises charging a capacitor towards the supply voltage at a constant current provided by a current source or discharging a capacitor from the supply voltage by sinking a constant current provided by a current sink.

42. The method of claim 39 wherein generating the second delayed signal further comprises providing a resistance for driving a current proportional to the supply voltage to charge or discharge a capacitor.

43. The method of claim 39 further comprising generating at least one additional delayed output signal and at least one additional second delayed signal to provide additional delays to the delayed signal.

44. A method for providing a delayed signal, the method comprising:
receiving a supply voltage and an input signal;
receiving a constant reference current insensitive to temperature variations;
generating a delayed output signal from the received input signal, the delay time of the delayed output signal being determined by the time it takes to charge a capacitor by the constant reference current to a predetermined percent of the supply voltage; and
generating a second delayed signal from the received delayed output signal, the delay time of the second delayed signal being inversely proportional to the magnitude of the supply voltage.

45. The method of claim 44 wherein receiving the constant reference current comprises:
generating a temperature dependent current proportional to absolute temperature;
generating an inverse temperature dependent current complimentary to absolute temperature; and
summing the temperature dependent current and the inverse temperature dependent current to generate the constant reference current having a net temperature coefficient of zero.

46. The method of claim 44 wherein the predetermined percent of the supply voltage is 50%.

47. The method of claim 44 wherein the delay time of the second delayed signal is inversely proportional to the magnitude of the supply voltage is to substantially the same degree that the delayed output signal is proportional to the magnitude of the supply voltage.

48. The method of claim 44 wherein generating the delayed output signal further comprises receiving the constant reference current through a current source or a current sink to charge or discharge a capacitor respectively.

49. The method of claim 44 wherein generating the second delayed signal further comprises providing a resistance for driving a current proportional to the supply voltage to charge or discharge a capacitor.

50. The method of claim 44 further comprising generating at least one additional delayed output signal and at least one additional second delayed signal to provide additional delays to the delayed signal.

* * * * *